(12) United States Patent
Kudoh

(10) Patent No.: US 7,812,878 B2
(45) Date of Patent: Oct. 12, 2010

(54) SOLID-STATE IMAGING DEVICE AND IMAGING APPARATUS

(75) Inventor: Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 886 days.

(21) Appl. No.: 11/200,687

(22) Filed: Aug. 10, 2005

(65) Prior Publication Data

US 2006/0038904 A1   Feb. 23, 2006

(30) Foreign Application Priority Data

Aug. 11, 2004   (JP) .................... P2004-234061

(51) Int. Cl.
    H04N 5/335    (2006.01)
(52) U.S. Cl. .................................... 348/308
(58) Field of Classification Search ............. 250/208.1; 257/291, 292; 348/294, 300, 301, 302, 308
    See application file for complete search history.

(56) References Cited

U.S. PATENT DOCUMENTS

| | | | | |
|---|---|---|---|---|
| 3,971,065 | A * | 7/1976 | Bayer ......................... | 348/276 |
| 6,352,869 | B1 * | 3/2002 | Guidash ..................... | 438/16 |
| 6,956,605 | B1 * | 10/2005 | Hashimoto .................. | 348/301 |
| 7,250,665 | B1 * | 7/2007 | Toros et al. ................. | 257/463 |
| 7,728,892 | B2 * | 6/2010 | Altice et al. ................ | 348/296 |
| 7,728,895 | B2 * | 6/2010 | Tanaka et al. ............... | 348/302 |
| 2004/0080648 | A1 * | 4/2004 | Rhodes ....................... | 348/308 |
| 2004/0108525 | A1 * | 6/2004 | Sekine ........................ | 257/202 |
| 2008/0180555 | A1 * | 7/2008 | Sato et al. ................... | 348/248 |

FOREIGN PATENT DOCUMENTS

| | | | |
|---|---|---|---|
| JP | 58215877 A | * | 12/1983 |
| JP | 61-156866 | | 7/1986 |
| JP | 03-019582 | | 1/1991 |
| JP | 04-286460 | | 10/1992 |
| JP | 2000-078475 | | 3/2000 |
| JP | 2001-298177 | | 10/2001 |
| JP | 2002-199284 | | 7/2002 |
| JP | 2003-189316 | | 7/2003 |
| JP | 2004-128193 | | 4/2004 |
| JP | 2004-158958 | | 6/2004 |
| JP | 2004-165992 | | 6/2004 |
| JP | 2004-172950 | | 6/2004 |

OTHER PUBLICATIONS

European Search Report dated Oct. 10, 2007.
Japanese Office Action issued on Jun. 30, 2009 in connection with JP Application No. 2004-234061.
Japanese Office Action issued on Nov. 10, 2009 in connection with corresponding JP Application No. 2004-234061.

* cited by examiner

*Primary Examiner*—David L Ometz
*Assistant Examiner*—Dillon Durnford-Geszvain
(74) *Attorney, Agent, or Firm*—Sonnenschein Nath & Rosenthal LLP

(57) ABSTRACT

A solid-state imaging device with a multi-pixel sharing structure, wherein the area of each photoelectric conversion element can be secured independent of a reduction in area of each pixel. A solid-state imaging device including photoelectric conversion elements arranged in a two-dimensional array and voltage conversion elements for converting charge produced by photoelectric conversion through the corresponding photoelectric conversion elements into voltage.

14 Claims, 15 Drawing Sheets

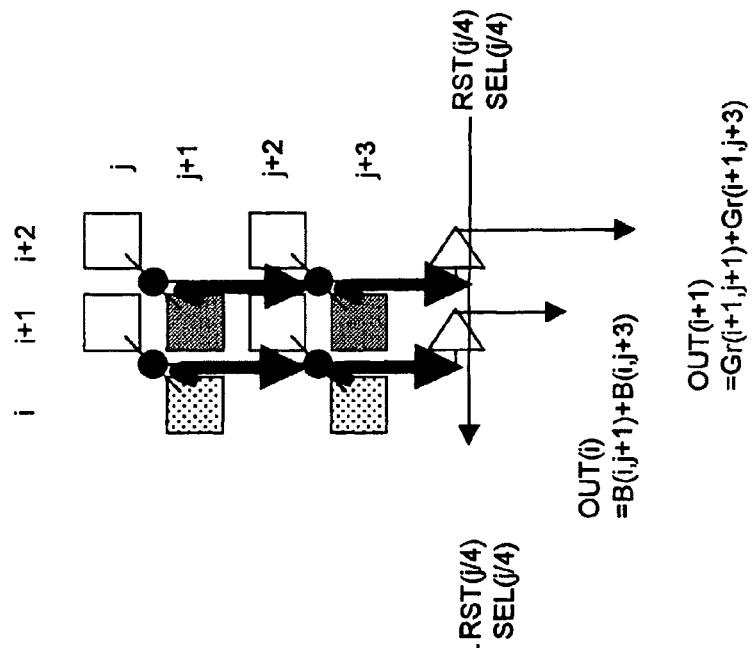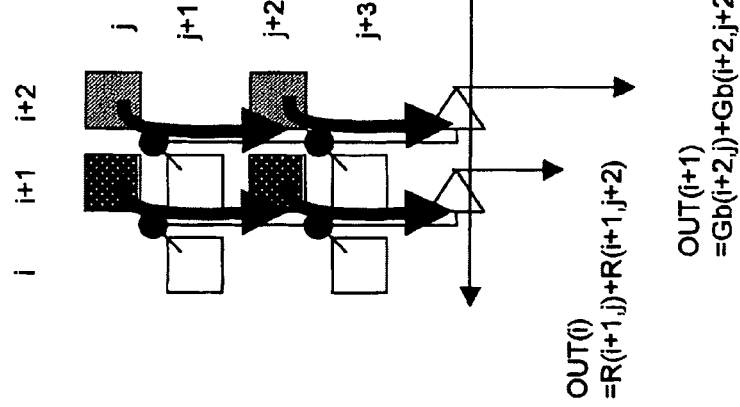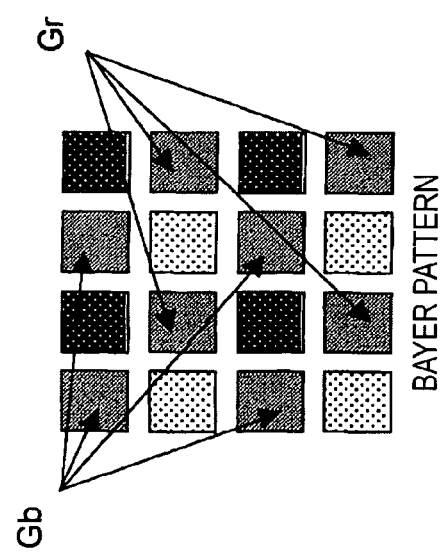

CORRECTION COEFFICIENTS $$\alpha_B \approx \alpha_{Gr}$$
$$\alpha_R \approx \alpha_{Gb}$$

$$\alpha_{Gr}\big|_{x,y} = \frac{2Gr\big|_{x,y}}{\left(Gr\big|_{center} + Gb\big|_{center}\right)}$$

$$\alpha_{Gb}\big|_{x,y} = \frac{2Gb\big|_{x,y}}{\left(Gr\big|_{center} + Gb\big|_{center}\right)}$$

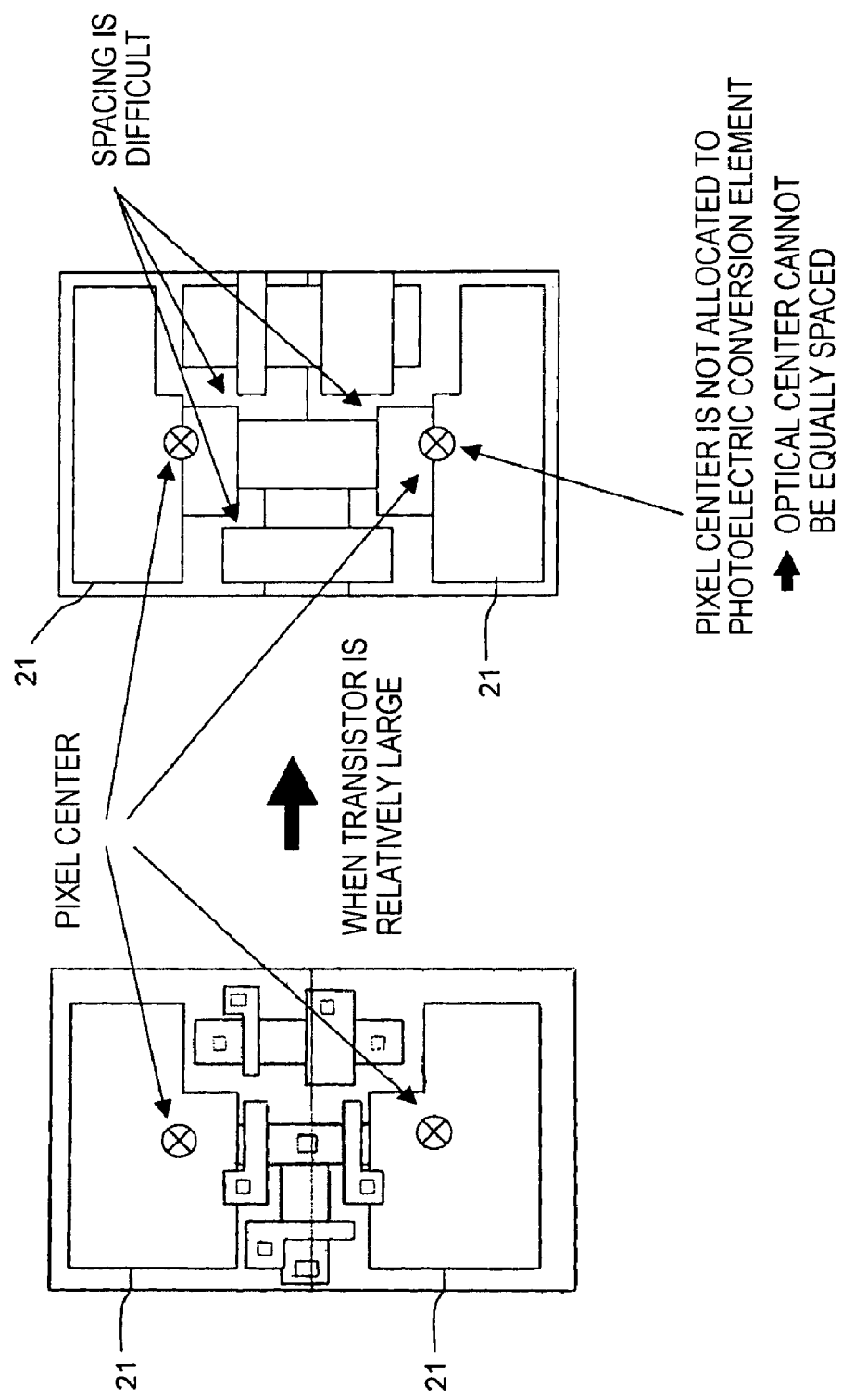

FIG. 13
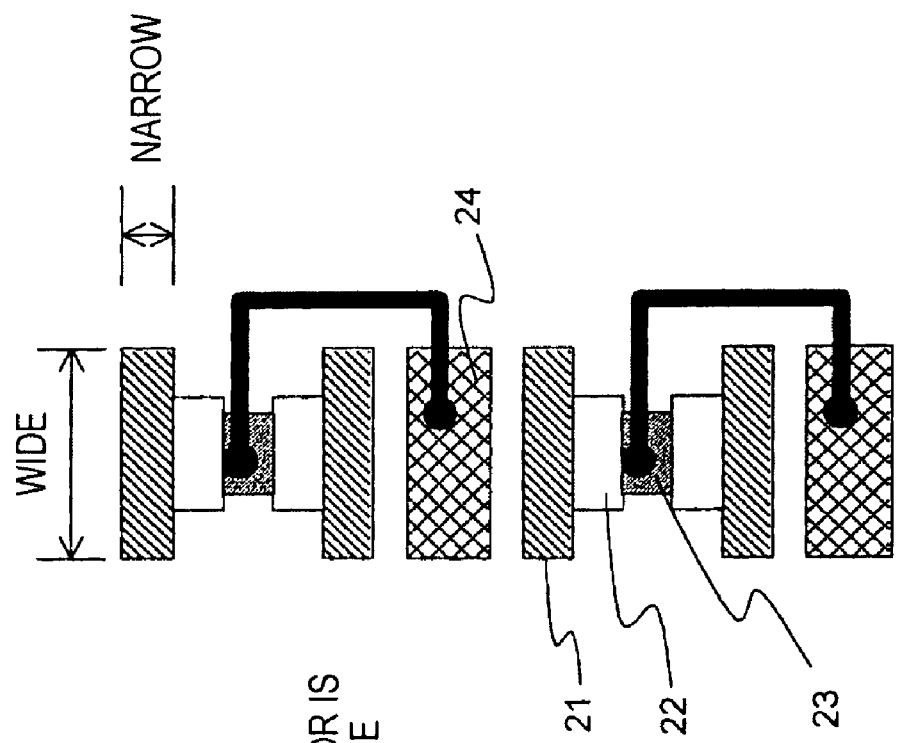
WHEN TRANSISTOR IS RELATIVELY LARGE
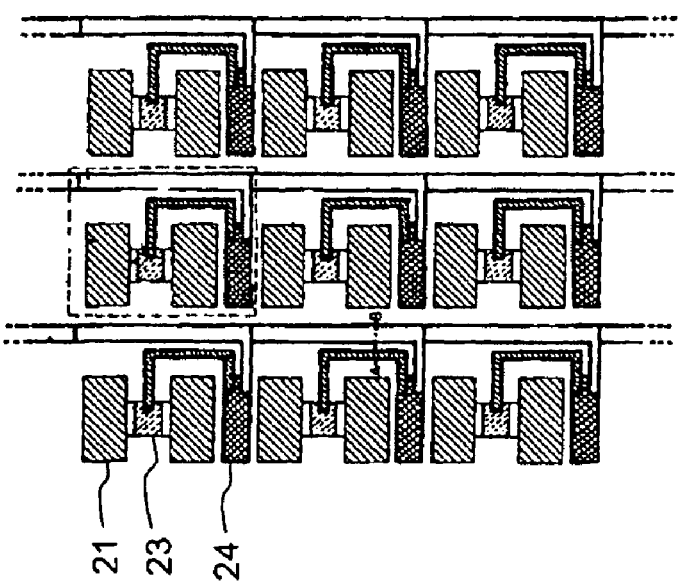
Prior Art

SOLID-STATE IMAGING DEVICE AND IMAGING APPARATUS

CROSS REFERENCE TO RELATED APPLICATIONS

The present invention claims the benefit of Japanese Patent Application JP 2004-234061 filed in the Japanese Patent Office on Aug. 11, 2004, the entire contents of which are incorporated herein by reference.

FIELD OF THE INVENTION

The present invention relates to a solid-state imaging device used as an image pickup device and an imaging apparatus.

BACKGROUND OF THE INVENTION

Recently, image sensors using complementary metal oxide semiconductor (CMOS) (below, referred to as CMOS sensors) have come into wide use. CMOS is a standard technology used in IC manufacturing. The CMOS sensor does not require the same high drive voltage that a charge coupled device (CCD) needs. In addition, the CMOS sensor can be integrated with a peripheral circuit (on-chip structure). Advantageously, the CMOS sensor greatly contributes to reduced size.

The CMOS sensor includes a two-dimensional array of pixels. One pixel region includes many component transistors such as a photoelectric conversion element, a readout gate, a voltage conversion element, a reset gate, and an amplifier. Accordingly, it is difficult to reduce the size of a pixel. A structure in which the components required for each pixel are partially shared between a plurality of pixels to reduce the area occupied by one pixel excluding the photoelectric conversion element, i.e., a multi-pixel sharing structure has recently been proposed. Such a technique is absolutely required to reduce the size of each pixel in the CMOS sensor. FIG. 12 shows a structure as a specific example. In the structure, a voltage conversion element and other circuit components (transistors such as a reset gate and similar components) to be shared are arranged between two photoelectric conversion elements 21. FIG. 13 shows another structure in which a voltage conversion element 23 and other circuit components are shared between two photoelectric conversion elements 21 and two readout gates 22 and the shared circuit components are arranged in each transistor region 24 adjacent to the photoelectric conversion elements 21.

In the conventional multi-pixel sharing structure, however, the photoelectric conversion elements and the component transistors cannot actually be arranged uniformly. Therefore, the degree of sharing the component transistors is not always proportional to the area occupancy ratio of the photoelectric conversion element. The reason is that the size of a component transistor in each small pixel is large relative to the pixel size and flexibility in shape is not high due to the limits of manufacturing techniques and those of physical properties. It is absolutely essential that the optical centers of pixels be equally spaced two-dimensionally and all of the pixels have the same fundamental characteristics. Therefore, even if the area (transistor area) occupied by transistors excluding the photoelectric conversion element in each pixel is reduced, a free space formed by reducing the occupied area cannot effectively be used because it is necessary to assign high priority to uniform arrangement, i.e., symmetry. In other words, when a free space is effectively utilized, the optical pixel centers cannot be equally spaced two-dimensionally.

For example, in the multi-pixel sharing structure shown in FIG. 12, when the size of each component transistor is small relative to the pixel area, the component transistors can be arranged in a space between the photoelectric conversion elements 21. As the pixel area becomes smaller, the spacing between transistors or that between interconnects used for connection becomes narrower. This leads to poor design flexibility. It is difficult to allocate the photoelectric conversion element 21 to the optical center (pixel center) of each pixel.

In the multi-pixel sharing structure shown in FIG. 13, a region for the photoelectric conversion element 21 is separated from the transistor region 24. Accordingly, this structure is efficient in terms of pixel arrangement. A well-balanced arrangement layout can also be provided. However, since the transistor regions 24 and the regions for the photoelectric conversion elements 21 are aligned, if the transistor region 24 is large, the region for the photoelectric conversion element 21 is widely reduced. Consequently, it is difficult to allocate the photoelectric conversion element 21 to the optical center (pixel center) of each pixel. It is further difficult to ensure the amount of signal charge accumulatable in each photoelectric conversion element 21.

In addition to the multi-pixel sharing structures shown in FIGS. 12 and 13, another multi-pixel sharing structure in FIG. 14 is available. According to the structure, the photoelectric conversion elements 21 are vertically arranged. In this multi-pixel sharing structure, however, since the number of shared voltage conversion elements 23 is few and the capacity of the diffusion layer is increased the voltage conversion efficiency may decrease. Further, the other multi-pixel sharing structure in FIG. 15 is also available. In the structure, sharing in the vertical direction is combined with that in the horizontal direction. In this multi-pixel sharing structure, it is necessary to read out signals of one row such that the signals are divided into two parts. Also disadvantageously, output signals may be different from typical video signals.

Accordingly, it is an object of the present invention to provide a solid-state imaging device with a multi-pixel sharing structure in which even when each pixel area is reduced, the sufficient area for each photoelectric conversion element can be ensured by effectively using a free space and the photoelectric conversion element is allocated to the optical center of each pixel such that the optical pixel centers can be equally spaced two-dimensionally.

SUMMARY OF THE INVENTION

According to one embodiment of the present invention, There is provided a solid-state imaging device including photoelectric conversion elements arranged in a two-dimensional array and voltage conversion elements for converting charge, produced by photoelectric conversion through the photoelectric conversion elements, into voltage, wherein each of said voltage conversion elements is arranged between two diagonally adjacent photoelectric conversion elements in the two-dimensional array and is shared between the two photoelectric conversion elements.

Also, the present invention provides a solid-state imaging apparatus comprising photoelectric conversion elements arranged in a two-dimensional array and voltage conversion elements which convert charge, generated by photoelectric conversion through the corresponding photoelectric conversion elements, into voltage and optical systems through which incident light gets to said photoelectric conversion elements, wherein each of said voltage conversion elements is arranged between two diagonally adjacent photoelectric conversion elements in the two-dimensional array and is shared between the two photoelectric conversion elements.

BRIEF DESCRIPTION OF THE DRAWINGS

FIGS. 3A to 3C are diagrams explaining a third example of the schematic structure of the CMOS sensor according to the first embodiment of the present invention, FIGS. 3B and 3C showing examples of signal readout.

FIG. 12 includes diagrams explaining a first example of a multi-pixel sharing structure in a conventional CMOS sensor.

FIG. 13 includes diagrams explaining a second example of the multi-pixel sharing structure of the conventional CMOS sensor.

DESCRIPTION OF THE PREFERRED EMBODIMENTS

A solid-state imaging device according to the present invention will now be illustrated below with examples of CMOS sensors with reference to the drawings.

Figure 1:
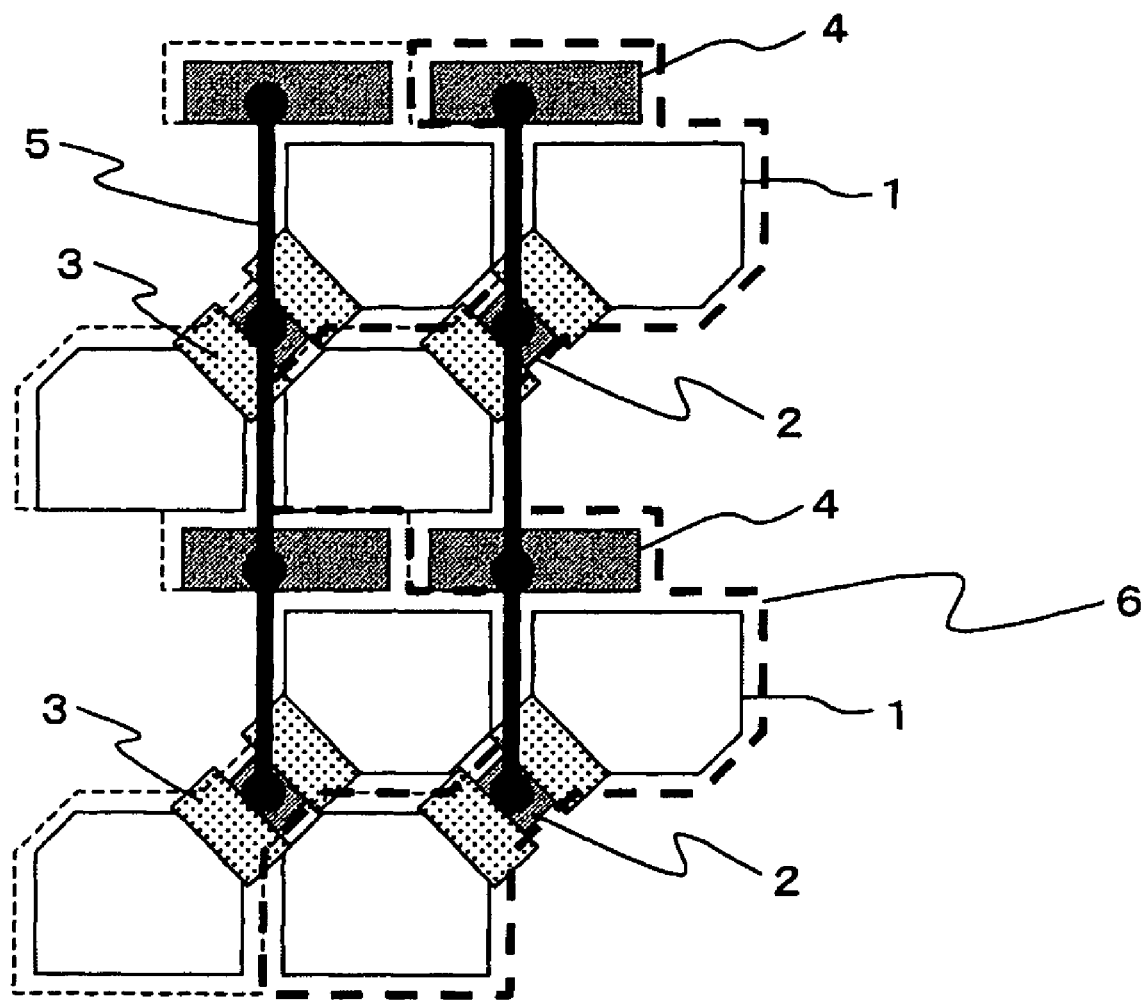
FIG. 1 is a diagram explaining a first example of the schematic structure of a CMOS sensor according to a first embodiment of the present invention, FIG. 1 showing a layout example of components.
Figure 2A:
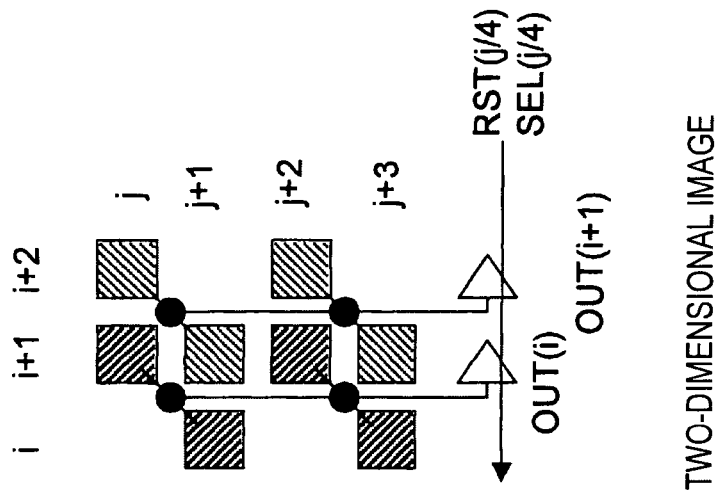
FIGS. 2A and 2B are diagrams explaining a second example of the schematic structure of the CMOS sensor according to the first embodiment of the present invention, FIG. 2A showing an example of the circuit configuration.
Figure 2B:
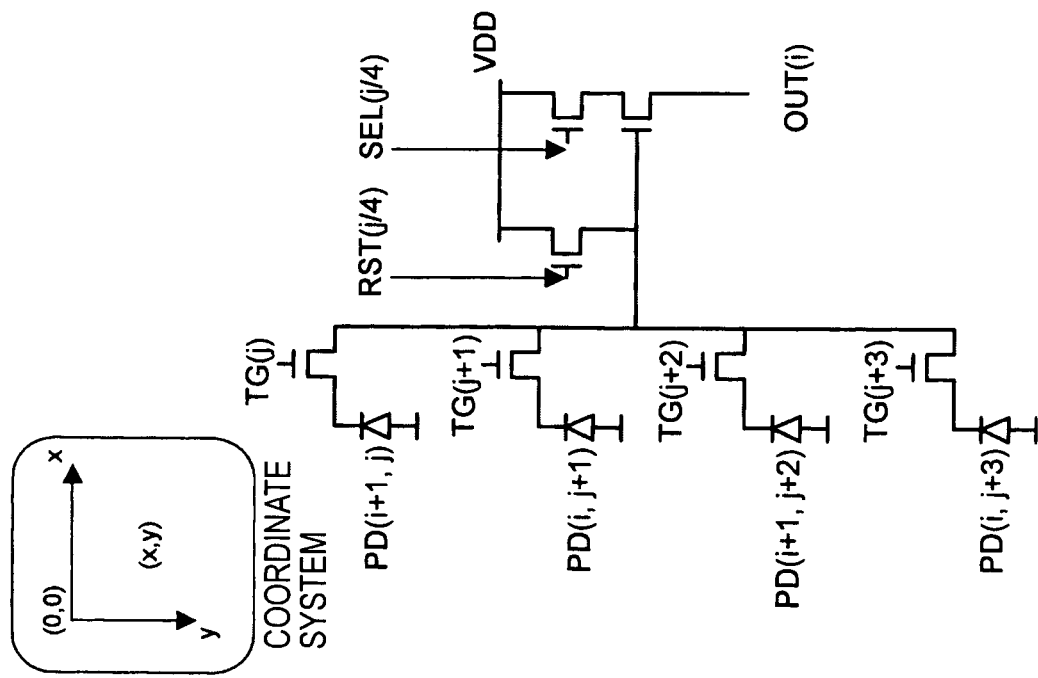

A first embodiment of the present invention will now be described. FIGS. 1 to 3C show an example of the schematic structure of a CMOS sensor according to the first embodiment. FIG. 1 shows an example of the layout of components. FIGS. 2A and 2B show an example of the circuit configuration. FIGS. 3B and 3C show examples of signal readout.

Referring to FIG. 1, according to the first embodiment, the CMOS sensor includes photoelectric conversion elements 1 for photoelectric conversion, voltage conversion elements 2 for converting charge, produced by photoelectric conversion through the photoelectric conversion element, into a voltage signal, transfer gates 3 for controlling the readout of charge from the photoelectric conversion element 1 to the voltage conversion element 2, transistor regions 4 where circuit sets (i.e., sets of circuit components including transistors such as a reset gate and similar components) for processing voltage signals obtained through the corresponding voltage conversion elements are arranged, and interconnects 5 for electrically connecting the voltage conversion elements 2 to the corresponding circuit set in the transistor regions 4. The components 1 to 5 are substantially similar to those of a known CMOS sensor. Accordingly, a detailed description of the components is omitted.

The big feature of this CMOS sensor is the arrangement layout of the above-mentioned components 1 to 5. Specifically, as shown in FIG. 1, the CMOS sensor has a structure in which the photoelectric conversion elements 1 are arranged in a two-dimensional array including a plurality of columns and a plurality of rows. Each voltage conversion element 2 is arranged between two diagonally adjacent photoelectric conversion elements 1 in the two-dimensional array and is shared between the two photoelectric conversion elements 1 through the transfer gates 3 respectively provided for the corresponding photoelectric conversion elements 1. For example, referring to FIG. 2B, in the two-dimensional array composed of columns i, i+1, i+2, . . . and rows j, j+1, j+2, . . . , one voltage conversion element 2 is shared between the photoelectric conversion element 1 at coordinates (i+1, j) and the photoelectric conversion element 1 at coordinates (i, j+1), and another voltage conversion element 2 is shared between the photoelectric conversion element 1 at coordinates (i+1, j+2) and the photoelectric conversion element 1 at coordinates (i, j+3).

Referring to FIG. 1, each transistor region 4 is arranged between the photoelectric conversion elements 1, with no voltage conversion element 2 there between. Each circuit set distributed in the transistor regions 4 is shared between the two voltage conversion elements 2 electrically connected to the circuit set via the interconnect 5. Referring to FIG. 2A, the shared circuit set includes a reset (RST) transistor and a select (SEL) transistor. The circuit components are distributed in the transistor regions 4.

In other words, as shown in FIG. 1, the above-mentioned CMOS sensor has a structure in which one circuit set distributed in two transistor regions 4 aligned in the vertical direction in the two-dimensional array is shared between two voltage conversion elements 2 aligned in the same vertical direction, and each of the voltage conversion elements 2 is shared between two diagonally adjacent photoelectric conversion elements 1 in the two-dimensional array. One circuit set, two voltage conversion elements 2, and four photoelectric conversion elements 1 constitute one sharing unity (unit block) 6.

As mentioned above, according to the present embodiment, the CMOS sensor has a multi-pixel sharing structure in which one voltage conversion element 2 is arranged between two diagonally adjacent photoelectric conversion elements 1 such that the photoelectric conversion element 1 is shared there between. Consequently, the size of each voltage conversion element 2 in the orthogonal direction is $1/\sqrt{2}$ of that in a conventional structure in which each voltage conversion element is shared between photoelectric conversion elements aligned in the vertical or horizontal direction in a two-dimensional array. In addition, when the voltage conversion elements 2 are arranged in this manner, a part of each transfer gate 3 protruded toward the corresponding photoelectric conversion element 1 is small. Thus, the space between the photoelectric conversion elements 1 can be reduced. Further, since each voltage conversion element 2 is positioned in the center of the spacing between pixels in the horizontal direction, each interconnect 5, extending to the transistor regions 4 separately arranged in the vertical direction, has a simple form such that the interconnect 5 hardly interferes with another interconnect 5. Concerning the transfer gate 3 generally comprising polysilicon, the parallel arranged parts of the transfer gates 3 are used for signal readout. Accordingly, each transfer gate 3 can be connected to the corresponding interconnect 5 in a small isolation region without being restricted by the possible spacing between the transfer gates 3.

According to the above-mentioned sharing structure, in each sharing unity region, the area of each photoelectric conversion element 1 depends on only the width of the isolation region. Since it is difficult to reduce the area of the transistor region 4, area efficiency is increased depending on the arrangement of the voltage conversion elements 2, which are substantially shape-independent. A free space between the diagonally adjacent photoelectric conversion elements 1 is effectively used for the arrangement of the voltage conversion element 2, thus reducing an invalid region in the vicinity of the voltage conversion element 2. Consequently, each space between the photoelectric conversion elements 1 (distance there between in the vertical or horizontal direction in the two-dimensional array) can be reduced. In addition, the sufficient area of a region for the photoelectric conversion element 1 relative to each pixel area can be secured. Furthermore, the photoelectric conversion element 1 is allocated to the optical center of each pixel, so that the optical pixel centers can easily be equally spaced two-dimensionally.

In other words, in the multi-pixel sharing structure, since the formation of an invalid region in the vicinity of each shared voltage conversion element 2 can be suppressed, the area of the region for each photoelectric conversion element 1 can be increased and equally spacing the pixel centers can be easily realized. The amount of saturation signal in the photoelectric conversion element 1 increases due to the increase in area of the region for the photoelectric conversion element 1, thus improving dynamic range. As the amount of signal charge is larger, the relative amount of random noise becomes smaller, especially under increased light conditions, thus increasing the S/N ratio. Therefore, an increase in image quality of an output signal can be expected.

According to the CMOS sensor of the present embodiment, the circuit components constituting one circuit set are distributed in two transistor regions 4. Accordingly, the well-balanced uniform arrangement of the circuit set can be assigned to the corresponding photoelectric conversion elements 1 in the two-dimensional array. Even if it is difficult to reduce the area of the transistor region 4, the sufficient area of the region for the photoelectric conversion element 1 can be secured relative to each pixel area. In addition, the photoelectric conversion element 1 is allocated to the optical center of each pixel, so that the optical pixel centers can easily be equally spaced two-dimensionally.

The above description relates to the case where one sharing unity 6 includes four photoelectric conversion elements 1, i.e., the case of sharing by four pixels. The present invention is not limited to this case. So long as the sharing relationship is established between even-numbered pixels, similar driving can be realized. As the number of sharing pixels increases, the capacitance of the voltage conversion element 2 increases. Therefore, an output voltage of the voltage conversion element 2 tends to lower relative to the amount of signal charge. This reduces the amplitude of an input signal to be supplied to amplification portion. This may lead to degradation in noise immunity. As the number of sharing pixels increases, the area of each photoelectric conversion element 1 becomes larger. The rate of increase in area depends on the degree of sharing with respect to shared circuit components. Accordingly, as the sharing degree increases, the increase rate decreases. Although the capacitance of the voltage conversion element 2 can be improved by optimizing the concentration of an impurity, the improvement is limited. Accordingly, the sharing by four pixels described in the first embodiment is the most balanced sharing structure.

In the CMOS sensor according to the present embodiment, each voltage conversion element 2 is shared between diagonally adjacent photoelectric conversion elements 1. Concerning readout, since the pixels (photoelectric conversion elements 1) sharing each voltage conversion element 2 are positioned in different rows in the two-dimensional array, charge can simultaneously be read out every row. Therefore, the above structure is very suitable for the use of a Bayer-pattern color filter array, shown in FIG. 3A, in which red (R) and green (G) alternate in order of R, G, R, G, . . . in a row in a two-dimensional array and green and blue (B) alternate in order of G, B, G, B, . . . in the next row. When the Bayer-pattern color filter array is used, G is assigned to each of four photoelectric conversion elements 1 in one sharing unity 6. Alternatively, R is assigned to two of the four elements and B is assigned to the other two elements. Therefore, one sharing unity 6 includes two pairs of photoelectric conversion elements 1, each pair having the same spectral sensitivity. The same color is assigned to the photoelectric conversion elements 1 in the odd-numbered rows and the other same color is assigned to those in the even-numbered rows.

Accordingly, when the Bayer-pattern color filter array is used, as shown in FIGS. 3B and 3C, the CMOS sensor supports a driving mode in which charge is simultaneously read out from the photoelectric conversion elements 1 having the same spectral sensitivity among the photoelectric conversion elements 1 constituting one sharing unity 6 and signals based on charge are added through the voltage conversion elements 2 in the sharing unity 6. Thus, high-speed signal readout from the photoelectric conversion elements 1 can also be performed. In other words, according to a charge addition function in the driving mode, the voltage conversion elements 2 can perform charge addition of two rows with respect to the same-color photoelectric conversion elements. Consequently, the number of output rows is reduced to ½, thus realizing high-speed signal readout.

Furthermore, according to the present embodiment, the CMOS sensor has a structure in which in each sharing unity the circuit set is shared between two voltage conversion elements 2 in the column direction in the two-dimensional array, i.e., the two voltage conversion elements 2 are aligned vertically. Therefore, driving signals for simultaneous readout are supplied to the circuit sets arranged in the same row in the two-dimensional array, so that it is easily possible to simultaneously read charge from the photoelectric conversion elements 1 arranged in the same row in the two-dimensional array. In other words, when each voltage conversion element 2 is shared between diagonally adjacent photoelectric conversion elements 1, pixels (photoelectric conversion elements) sharing each voltage conversion element 2 are assigned to different rows in the two-dimensional array. Thus, signals based on charge can be simultaneously read out every row. Further, when each circuit set in the transistor regions 4 is shared between two voltage conversion element 2, simultaneous readout of every row is not obstructed so long as the voltage conversion element 2 are aligned in the column direction. In the above-mentioned simultaneous readout, therefore, high-speed signal readout can also be realized.

Figure 4:
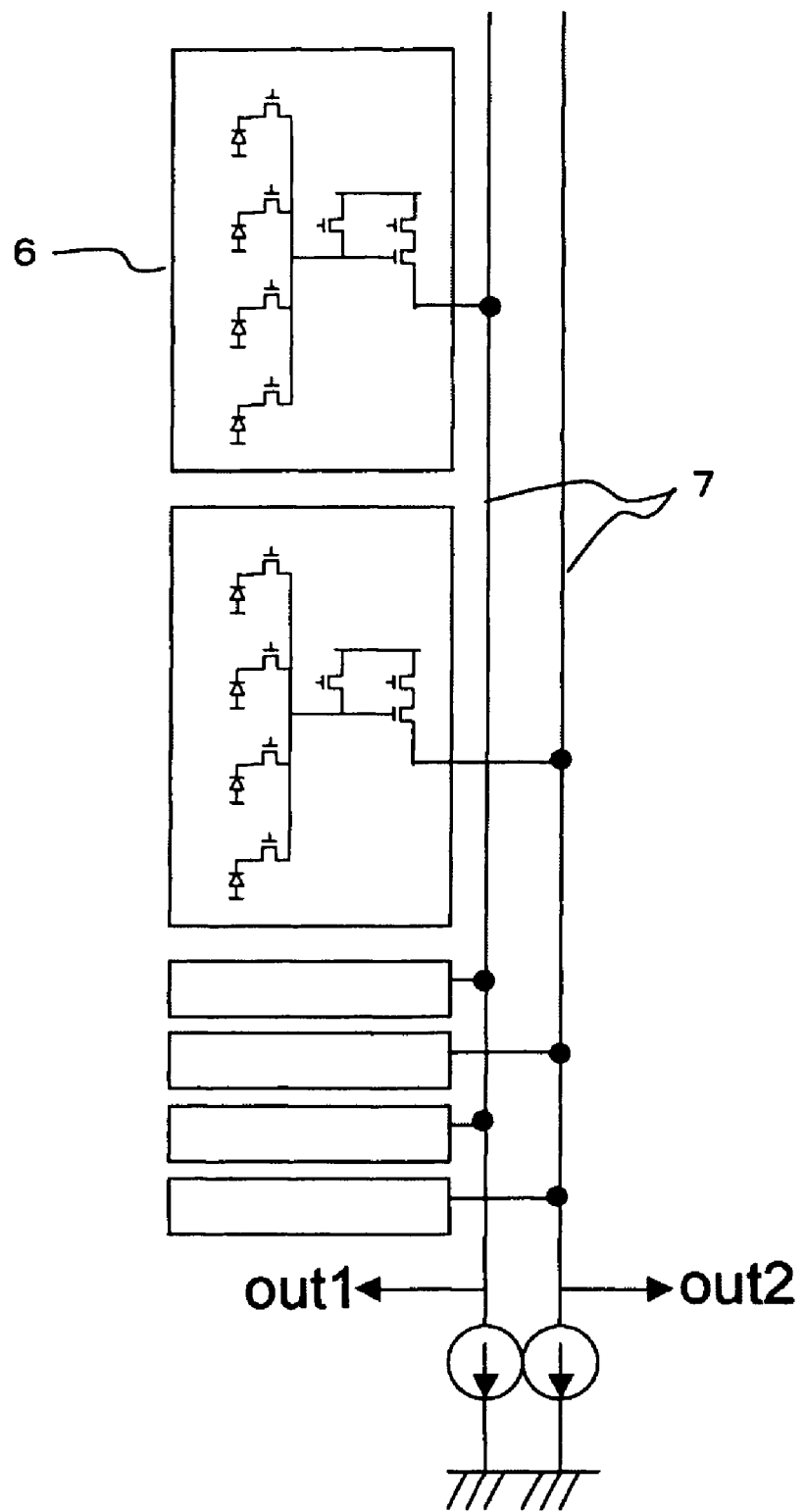
FIG. 4 is a diagram explaining an example of the schematic structure of a CMOS sensor according to a second embodiment of the present invention.

A second embodiment of the present invention will now be described. FIG. 4 is a diagram explaining an example of the schematic structure of a CMOS sensor according to the second embodiment.

As shown in the diagram, in the CMOS sensor according to the second embodiment, a plurality of vertical signal lines 7 are arranged to read a voltage signal processed through each circuit set. The voltage signals are simultaneously read out from a plurality of sharing unities 6 arranged in the column direction in the two-dimensional array through the signal lines 7. According to the above structure, signal outputs of the sharing unities 6 are simultaneously obtained for each signal line 7, so that the time required to obtain one image is reduced depending on the number of outputs. In other words, higher speeds can be realized.

Figure 5:
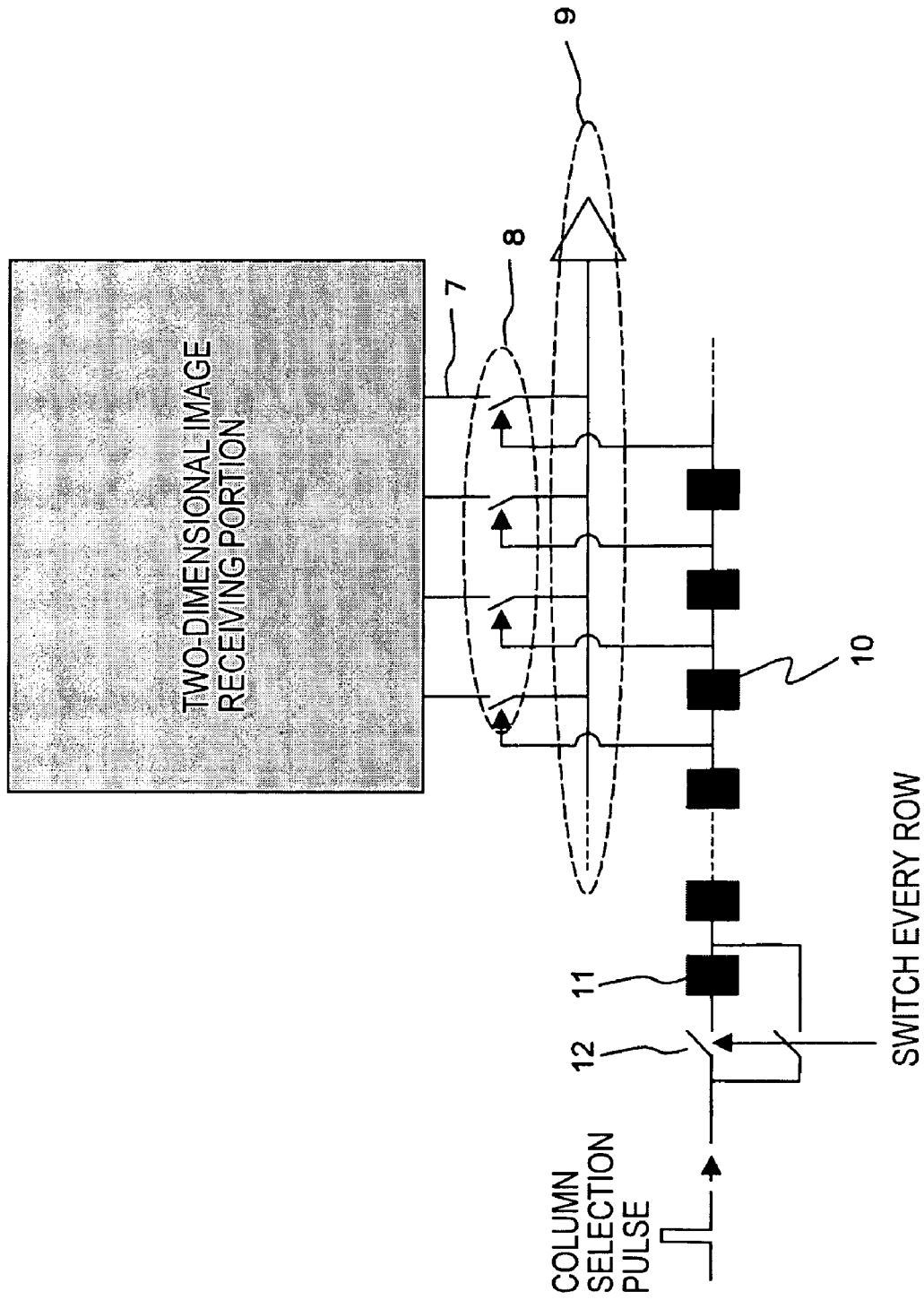
FIG. 5 is a diagram explaining a first example of the schematic structure of a CMOS sensor according to a third embodiment of the present invention.
Figure 6:
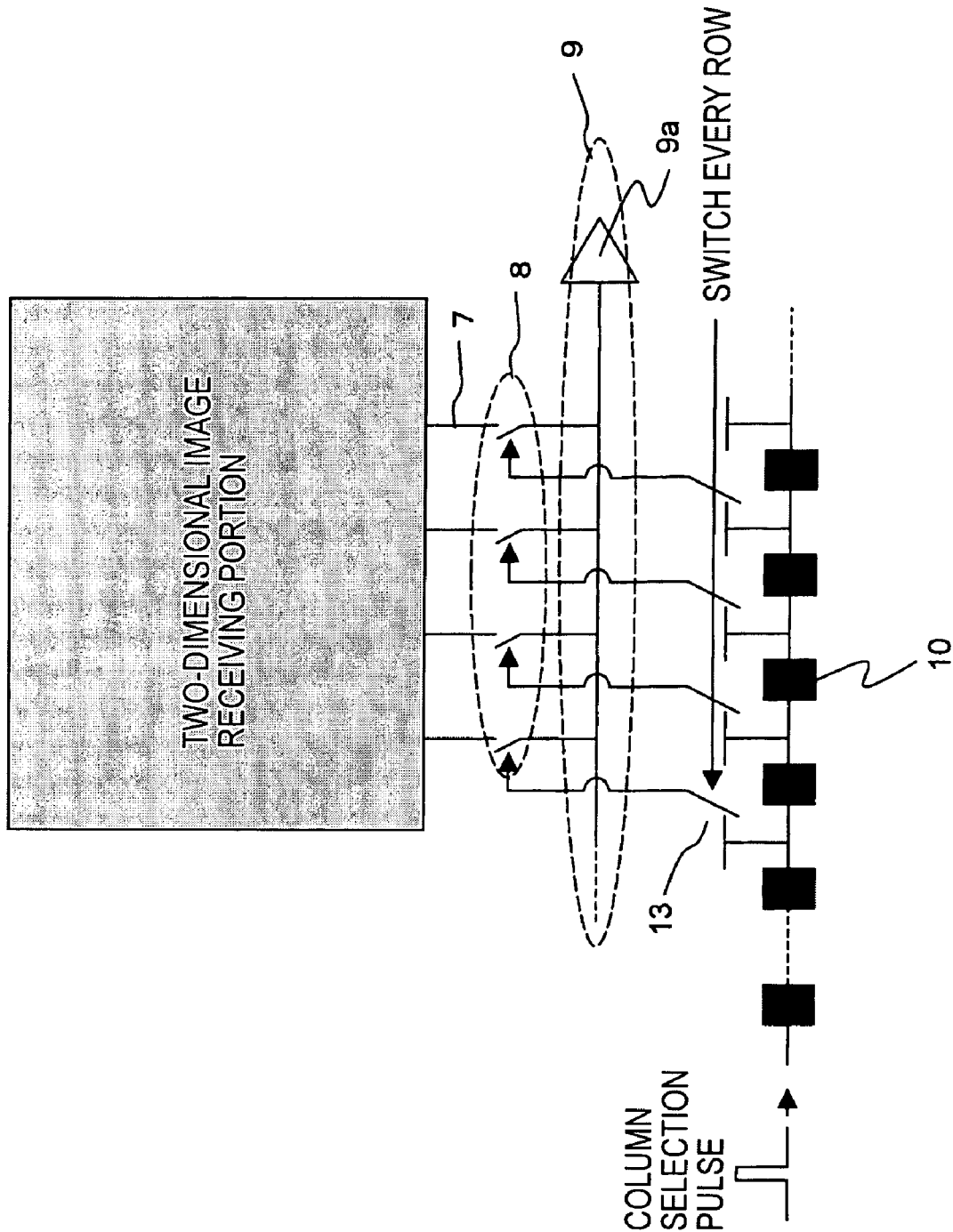
FIG. 6 is diagram explaining a second example of the schematic structure of the CMOS sensor according to the third embodiment of the present invention.

A third embodiment of the present invention will now be described. FIGS. 5 and 6 are diagrams explaining examples of the schematic structure of a CMOS sensor according to the third embodiment.

According to the third embodiment, the CMOS sensor includes a signal sequence permutation portion for correcting the difference in read-out signal sequence between the odd-numbered rows and the even-numbered rows in the two-dimensional array, the difference being caused by sharing each voltage conversion element 2 between diagonally adjacent photoelectric conversion elements 1. The reason is as follows.

As shown in FIG. 5 or 6, each signal line 7 to read a signal is connected to a row circuit 9 through a column selection switch 8 in a two-dimensional array such that a signal is generated from the signal line 7 to the row circuit 9. According to a multi-pixel sharing structure where each voltage conversion element 2 is shared between two diagonally adjacent photoelectric conversion elements 1, outputs of the photoelectric conversion elements 1 in the odd-numbered and even-numbered rows are supplied through different signal lines 7 to the row circuit 9. In order to obtain outputs equalized to those of the general CMOS sensor with a conventional structure, therefore, it is necessary to input a control signal for readout to the row circuit 9 such that the signal is shifted by one column. For this purpose, the CMOS sensor according to the third embodiment includes the signal sequence permutation portion.

Generally, signal outputs from the signal lines 7 to the row circuit 9 are controlled by cascade connection of delay circuits 10 as shown in the diagram. Time-shifted signals are sequentially input to the column selection switches 8 in the respective columns. According to the third embodiment, in the CMOS sensor, the signal sequence permutation portion delays an input signal to be supplied to the first stage so that the input signal is timed to data output of the general CMOS sensor.

In the above-mentioned signal sequence permutation portion, as shown in, e.g., FIG. 5, an additional delay circuit 11 may be arranged upstream of the first input stage and a switch 12 to bypass the delay circuit 11 can be further disposed. In such a structure, although it is unclear how to handle signals of the end columns, a horizontal blanking period is generally defined by a timing signal. In addition, in the signal sequence permutation portion, as shown in, e.g., FIG. 6, a switch 13 can be arranged so as to select two control signals supplied to the respective columns from a series of delay circuits 10. The two selected control signals correspond to time-shifted readout signals of one column. In this structure, analog signals supplied to an amplifier 9a at an output terminal of the row circuit 9 are not different from those of a general pixel array. In either example, since the CMOS sensor includes the signal sequence permutation portion, readout between the odd-numbered rows and the even-numbered rows can be switched. Accordingly, readout can be controlled using a timing signal synchronized with a control signal of the transfer gate 3.

Figure 7:
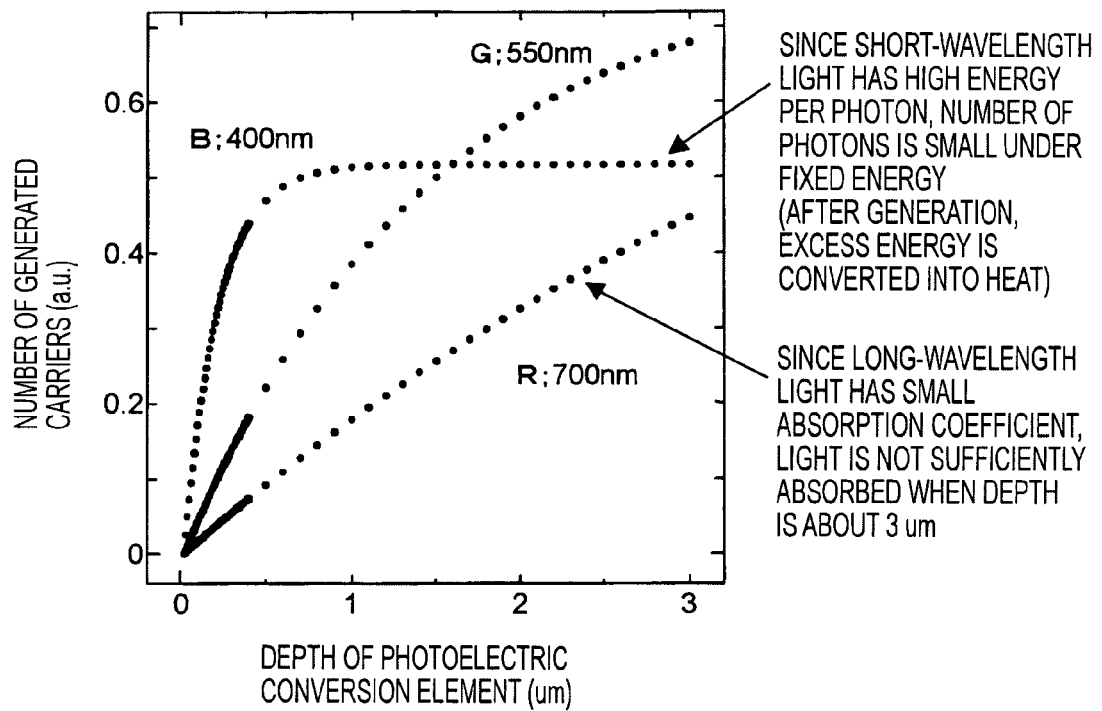
FIG. 7 is a diagram explaining the amounts of generated charge of respective color components.
Figure 8:
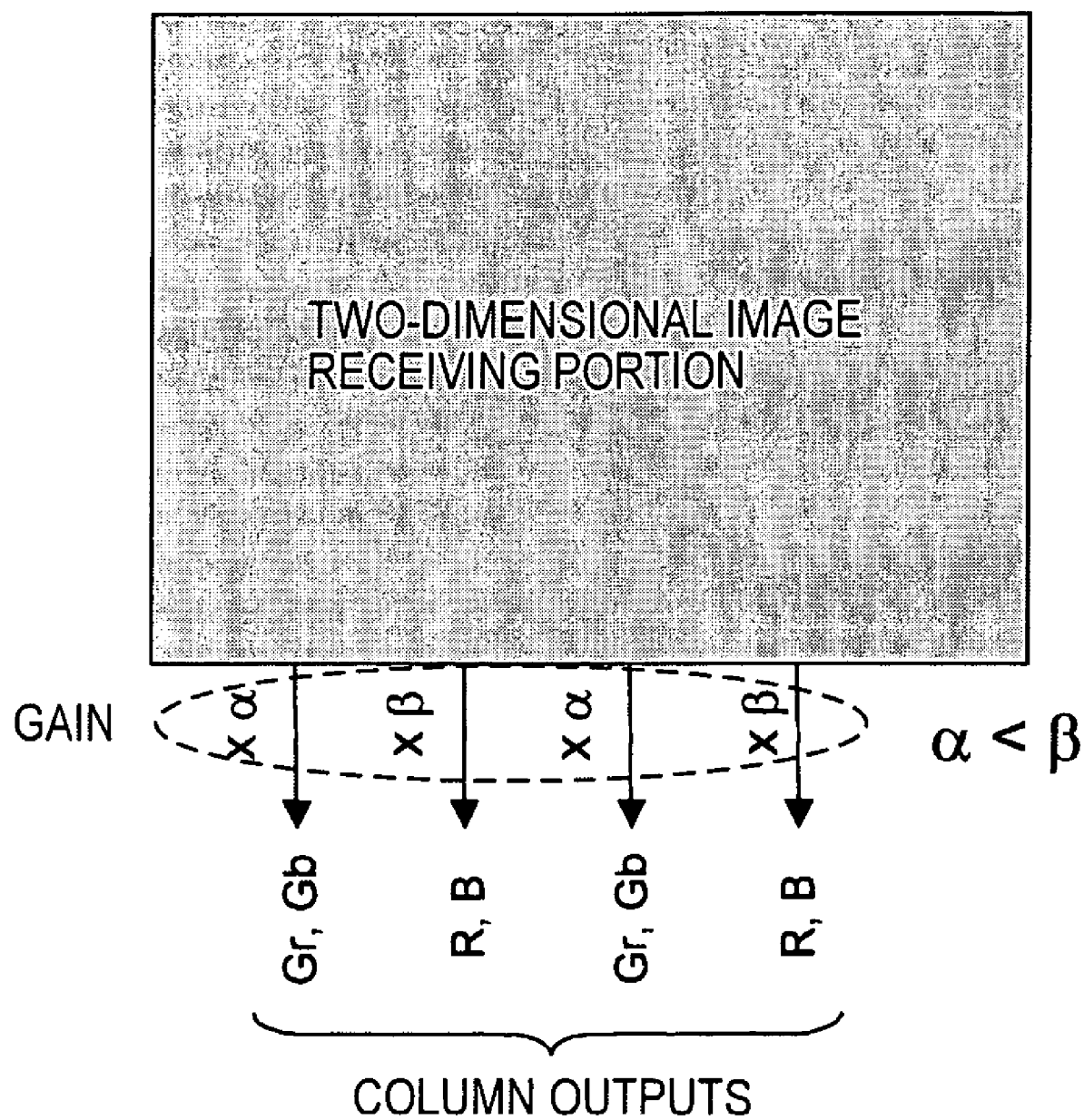
FIG. 8 is a diagram explaining a first example of the schematic structure of a CMOS sensor according to a fourth embodiment of the present invention.
Figure 9:
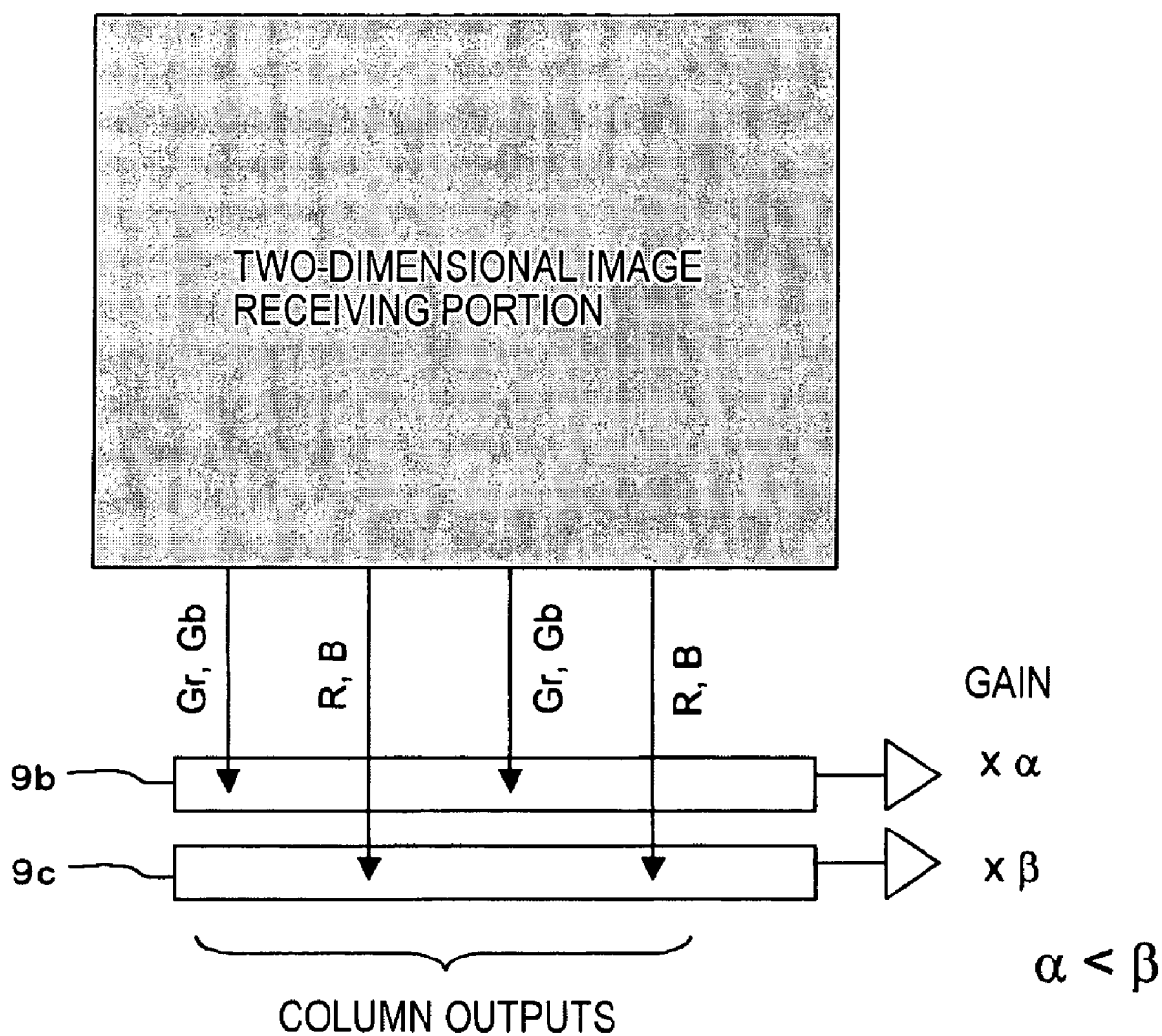
FIG. 9 is a diagram explaining a second example of the schematic structure of the CMOS sensor according to the fourth embodiment of the present invention.

A fourth embodiment of the present invention will now be described. FIG. 7 is a diagram explaining the amounts of produced charge of respective color components. FIGS. 8 and 9 are diagrams explaining examples of the schematic structure of a CMOS sensor according to the fourth embodiment.

In the CMOS sensor according to the fourth embodiment, a Bayer-pattern color filter array is arranged such that color filters are assigned to photoelectric conversion elements 1 arranged in a two-dimensional array, respectively (refer to FIG. 3A). The CMOS sensor is constructed such that an amplification factor with respect to an output voltage signal of each odd-numbered column in the two-dimensional array is different from that of each even-numbered column, i.e., signal amplification factors of signal lines to output voltage signals are different from each other. The reason is as follows.

In the arrangement of the Bayer-pattern color filter array, according to a multi-pixel sharing structure in which each voltage conversion element 2 is shared between two diagonally adjacent photoelectric conversion elements 1, signal lines are divided into output lines (Gr/Gb output lines) shared between Gr (G signals of columns where R pixels are arranged) and Gb (G signals of columns where B pixels are arranged) and output lines (B/R output lines) shared between B and R. As illustrated in FIG. 7, the B signal has such properties that the amount of produced charge is small and there is a loss due to the absorption of photons on the surface p+, and the R signal has such properties that most photons are not absorbed in the depth, where pn junction can be formed, of the photoelectric conversion element 1. Accordingly, the G signal has the minimum loss and a G signal output has a tendency to become larger. Therefore, if the gain (amplification factor) of each Gr/Gb output line is different from that of each B/R output line, the difference in spectral characteristic between RGB in chip output can be reduced.

Specifically, as shown in FIG. 8, the gain of each Gr/Gb output line is reduced and the gain of each B/R output line is increased. Since a known technique can be used for setting the gains, a description about setting is omitted.

According to the gain setting for each column, even when the CMOS sensor has a structure in which a signal output from each column is converted into a digital signal by AD conversion portion (e.g., an AD converter) provided for each column and digital signals generated from a plurality of columns are sequentially supplied to one signal output portion (e.g., a column circuit or an amplifier), the respective digital signals are subjected to gain adjustment such that the difference in spectral characteristic between RGB is reduced. Accordingly, the signal output portion can perform the digital signals uniformly, i.e., using the same process parameters.

For example, as shown in FIG. 9, outputs of the odd-numbered columns and those of the even-numbered columns in the two-dimensional array are connected to two different row circuits 9b and 9c, respectively. In this case, when the signal amplification factor of the signal line in each odd-numbered column is not different from that in each even-numbered column, the difference in spectral characteristic between RBG in chip output can be reduced, so long as the gains of the two row circuits 9b and 9c are different from each other. Thus, a variation in gain between columns can be suppressed. In the case where the gains of the row circuits 9b and 9c are different from each other, the gains can be set using a known technique. A description of the gain setting is omitted.

Figures 10A, 10B:
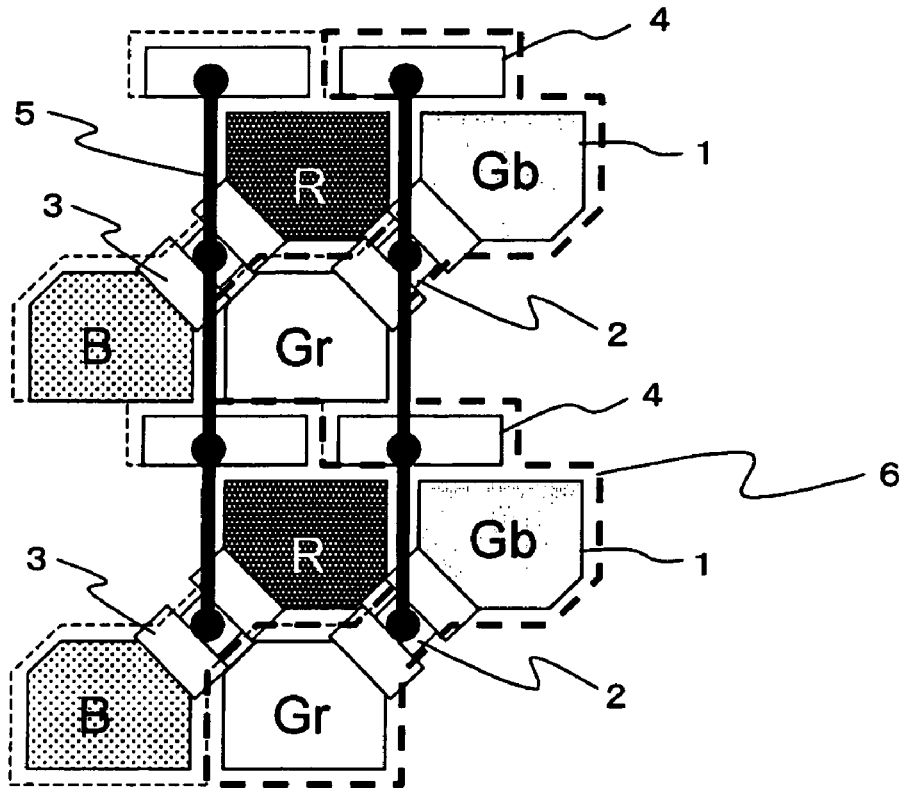
FIGS. 10A and 10B explain an example of the schematic structure of a CMOS sensor according to a fifth embodiment of the present invention.

A fifth embodiment of the present invention will now be described. FIGS. 10A and 10B explain an example of the schematic structure of a CMOS sensor according to the fifth embodiment.

In the CMOS sensor according to the fifth embodiment, a Bayer-pattern color filter array is arranged such that color filters are assigned to photoelectric conversion elements 1 disposed in a two-dimensional array, respectively. On the basis of a result of the comparison between detection signals generated from two diagonally adjacent photoelectric conversion elements 1 to which the filters having the same color are respectively assigned, the difference between output signals caused by difference in pixel layout is corrected. The reason is as follows.

In a multi-pixel sharing structure, generally, each voltage conversion element is shared between a plurality of photoelectric conversion elements. Since the shapes of the photoelectric conversion elements are symmetric, the amounts of produced signal may be different from each other due to a pattern misalignment in a manufacturing process or a variation in light incidence angle upon receiving light. Among the multi-pixel sharing structures, however, according to the multi-pixel sharing structure in which each voltage conversion element 2 is shared between two diagonally adjacent photoelectric conversion elements 1, when the Bayer-pattern color filter array is used, as shown in FIG. 10A, each Gr pixel and each Gb pixel is connected to the same voltage conversion element 2 and the Gr and Gb pixels belong to different rows. Therefore, there are the same combinations of components other than the pixel, i.e., the color and subsequent-stage connected circuits. Thus, the difference in amount of produced signal caused by difference in pixel shape is corrected.

In other words, in the CMOS sensor according to the fifth embodiment, on the basis of the result of the comparison between the detection signals generated from the Gr and Gb pixels, the output signal difference caused by the difference in pixel layout (arrangement position and the shape of the photoelectric conversion element) between two diagonally adjacent photoelectric conversion elements 1 is corrected using correction coefficients shown in FIG. 10B. The correction is applied to output signals from the B and R pixels, and the output signal difference caused by the difference in pixel layout may be corrected.

In the conventional sharing structure with the sharing relation between vertically or horizontally adjacent pixels (refer to FIGS. 12 and 13), since shared components of the same-color pixels are not identical to each other, the error is large. On the other hand, in the diagonal sharing structure, since correction is performed on the basis of the result of the comparison between detection signals from the Gr and Gb pixels, i.e., pixels having identical components excluding pixels, the error can be suppressed. Thus, in the case of the multi-pixel sharing structure, signal outputs with small output variations can be realized. Particularly, in the multi-pixel sharing structure in which each voltage conversion element 2 is shared between two diagonally adjacent photoelectric conversion elements 1, the correction error can be reduced and the correction coefficients can be easily calculated.

Figure 15:
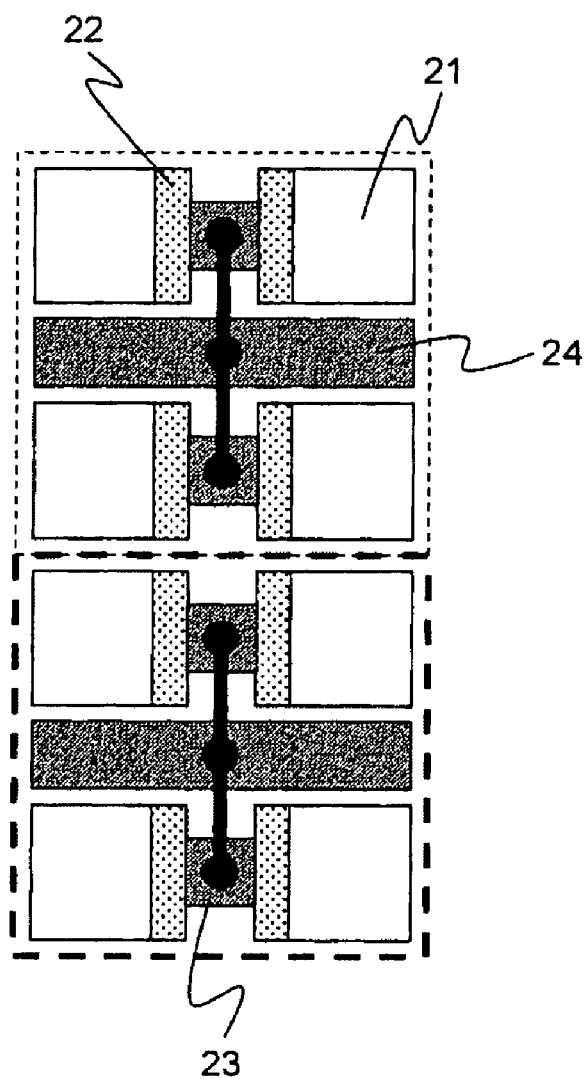
FIG. 15 is a diagram explaining a fourth example of the multi-pixel sharing structure of the conventional CMOS sensor.

Also, in other conventional sharing structures including both vertical sharing and horizontal sharing (refer to FIG. 15), since the number of pixel form patterns is increased to four, it is difficult to calculate the correction coefficients. On the other hand, in the diagonal sharing structure, since the above problem is sidestepped, correction coefficients can be easily obtained.

The above-mentioned correcting process can be easily applied to digital signals subjected to AD conversion. The correcting process for signal output can be performed using a known technique in a manner similar to the gain adjustment described in the fourth embodiment. A description of the correcting process is omitted.

Figure 11B:
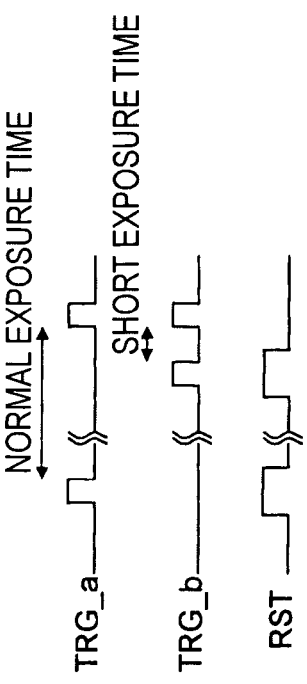
FIGS. 11A to 11C are diagrams explaining an example of the schematic structure of a CMOS sensor according to a sixth embodiment of the present invention.
Figure 11C:
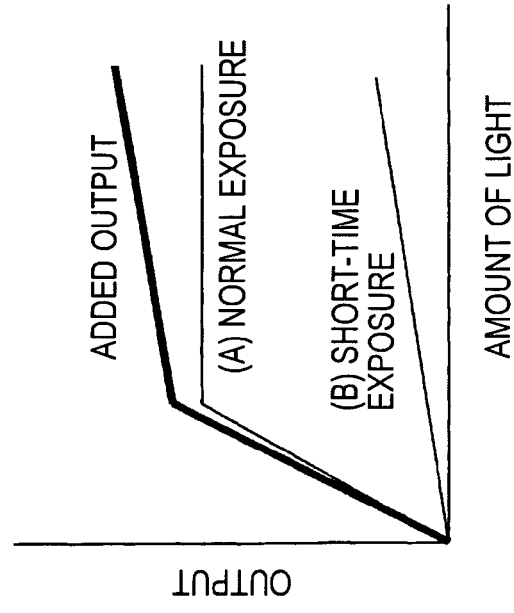
Figure 11A:
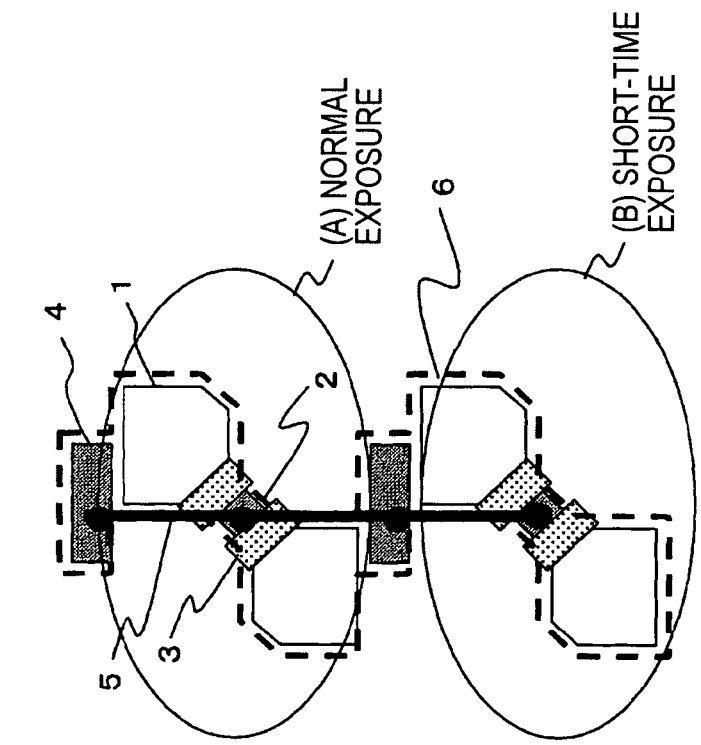
Figure 14:
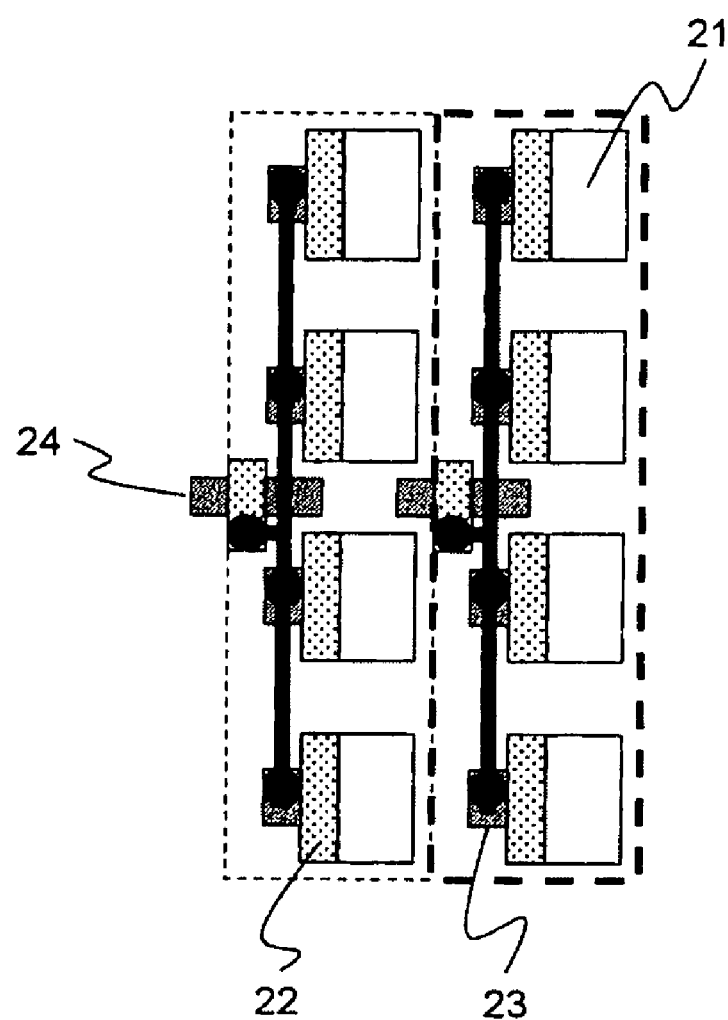
FIG. 14 is a diagram explaining a third example of the multi-pixel sharing structure of the conventional CMOS sensor.

A sixth embodiment of the present invention will now be described. FIGS. 11A to 11C are diagrams explaining an example of the schematic structure of a CMOS sensor according to the sixth embodiment.

In a manner similar to the first embodiment, the CMOS sensor according to the sixth embodiment supports a driving mode for signal addition based on the charge in voltage conversion elements 2 constituting each sharing unity 6. According to the sixth embodiment, the CMOS sensor is constructed such that in addition to the use of a charge addition function in the driving mode, photoelectric conversion times of photoelectric conversion elements 1, from which charge is simultaneously read out for the signal addition based on charge, are different from each other. The reason is as follows.

In a multi-pixel sharing structure, particularly, in a four-pixel sharing structure in which one sharing unity 6 includes four pixels, pixels sharing the voltage conversion elements 2 via an interconnect 5 include pixels having the same spectral characteristic, i.e., the pixels to which the same-color filters are assigned. Accordingly, the charge addition function can be used. In this case, as shown in FIGS. 11A and 11B, among the pixels from which charge is simultaneously read out, photoelectric conversion time of at least one photoelectric conversion element 1 connected to one voltage conversion element 2 is different from that of at least one photoelectric conversion element 1 connected to the other voltage conversion element 2. Thus, the sensitivity to low bright light is higher than that to high bright light, i.e., a wide dynamic range can be realized. The difference in photoelectric conversion time can be made by controlling readout pulses as shown in FIG. 11B. Under condition that the difference in photoelectric conversion time is provided, for example, when high bright light is incident, a pixel with normal accumulation time is saturated but a pixel with delayed accumulation start time is not saturated, thus obtaining the characteristics depending on light intensity. When the amounts of signal charge are added in the shared voltage conversion elements 2, an added signal output represents sensitivity characteristic as shown in FIG. 11C.

Preferred embodiments of the present invention have been described in the above-mentioned first to six embodiments. The present invention is not limited to the description. Variations and modifications of the present invention, e.g., appropriate combinations of the first to sixth embodiments can be made without departing from the spirit and scope of the invention.

The above-mentioned solid-state imaging device has a multi-pixel sharing structure in which one voltage conversion element is arranged between two diagonally adjacent photoelectric conversion elements such that the voltage conversion element is shared there between. Consequently, the size of each voltage conversion element in the orthogonal direction is $1/\sqrt{2}$ of that in a conventional structure in which each voltage conversion element is shared between photoelectric conversion elements aligned in the vertical or horizontal direction in a two-dimensional array. In other words, a free space between the diagonally adjacent photoelectric conversion elements is effectively used for the arrangement of the voltage conversion element, thus reducing an invalid region in the vicinity of the voltage conversion element. Consequently, each space between the photoelectric conversion elements (distance there between in the vertical or horizontal direction in the two-dimensional array) can be reduced. In addition, the sufficient area of a region for the photoelectric conversion element relative to each pixel area can be secured. Furthermore, the photoelectric conversion element is allocated to the optical center of each pixel, so that the optical pixel centers can easily be equally spaced two-dimensionally. When each voltage conversion element is shared between diagonally adjacent photoelectric conversion elements, pixels (photoelectric conversion elements) sharing each voltage conversion element are allocated to different rows in the two-dimensional array. Thus, signals can be simultaneously readout every row. When color filters are formed in respective pixels according to a Bayer pattern, the same color is assigned to the photoelectric conversion elements in the odd-numbered rows and the same color is assigned to those in the even-numbered rows in each sharing unity. Thus, the voltage conversion elements can perform charge addition of two rows with respect to the same-color photoelectric conversion elements. Consequently, high-speed signal readout from the photoelectric conversion elements can also be performed.

As mentioned above, according to the present invention, in the solid-state imaging device having the multi-pixel sharing structure, the formation of an invalid region in the vicinity of each shared voltage conversion element can be suppressed. The area of the region for each photoelectric conversion element can be increased and equally spacing the pixel centers can be easily realized. Therefore, the amount of saturation signal in the photoelectric conversion element increases due to the increase in area of the region for the photoelectric conversion element, thus improving dynamic range. As the amount of signal charge is larger, the relative amount of random noise becomes smaller under high light conditions, thus increasing the S/N ratio. Therefore, an increase in image quality of an output signal can be expected. Furthermore, in the multi-pixel sharing structure in which each voltage conversion element is shared between two diagonally adjacent photoelectric conversion elements, high-speed signal readout can be performed depending on a driving mode.

The present invention is also applied to an imaging apparatus, for instance, a camera or a camera module.

What is claimed is:

1. A solid-state imaging device comprising:
photoelectric conversion elements arranged in a two-dimensional array having a plurality of repeating first pairs of two pixels and repeating second pairs of two pixels extending along a relatively vertical direction;
voltage conversion elements to convert charges generated by corresponding photoelectric conversion elements into voltage; and
transistor regions including circuit sets each of which processes voltage signals converted by the corresponding voltage conversion elements, each circuit set being shared between two of the voltage conversion elements aligned in the vertical direction via an interconnect;
wherein,
first and second pairs are arranged in a diagonal direction in the two-dimensional array,
said voltage conversion elements are shared between at least one pair of a plurality of said first pairs and between at least one pair of a plurality of said second pairs along said vertical direction of said two-dimensional array,
at least one pair of said first and said second pairs is comprised by same color pixels.

2. The device according to claim 1, wherein
said transistor regions are assigned to said voltage conversion elements sharing the circuit set, and
circuit components included in the circuit set are distributed in the transistor regions.

3. The device according to claim 2, wherein one of the circuit sets, two of said voltage conversion elements, and four of said photoelectric conversion elements constitute one sharing unity.

4. The device according to claim 3, wherein a plurality of said photoelectric conversion elements having the same spectral sensitivity are included in one sharing unit.

5. The device according to claim 4, wherein the device supports a driving mode in which charges are simultaneously read out from said plurality of said photoelectric conversion elements having the same spectral sensitivity in the sharing unity.

6. The device according to claim 3, wherein the circuit set is shared between the voltage conversion elements of each sharing unity in the column direction in the two-dimensional array.

7. The device according to claim 6, wherein driving signals for simultaneous readout are supplied to the circuit sets arranged in the same row in the two-dimensional array such that charge is simultaneously read out from said photoelectric conversion elements arranged in the same row in the two-dimensional array.

8. The device according to claim 3, wherein a plurality of signal lines to read voltage signals processed by the circuit sets are arranged in each column in the two-dimensional array such that the voltage signals are simultaneously read through said plurality of signal lines from the sharing unities arranged in the column direction in the two-dimensional array.

9. The device according to claim 3, further comprising:
signal sequence permutation portion which corrects the difference in read-out signal sequence between the odd-numbered row and the even-numbered row in the two-dimensional array, the difference being caused by sharing each voltage conversion element in each sharing unity between two diagonally adjacent photoelectric conversion elements in the two-dimensional array.

10. The device according to claim 3, wherein
a Bayer-pattern color filter array is operatively arranged such that color filters are assigned to the respective photoelectric conversion elements arranged in the two-dimensional array, and
the amplification factor for an output voltage signal of the odd-numbered column in the two-dimensional array is different from that of the even-numbered column.

11. The device according to claim 10, wherein
a signal generated from each column in the two-dimensional array is converted into a digital signal every driving period for each row through AD conversion portion provided for each column of the two-dimensional array, and
the digital signals generated from the columns of the two-dimensional array are sequentially supplied to one signal output portion.

12. The device according to claim 3, wherein
a Bayer-pattern color filter array is operatively arranged such that color filters are assigned to the respective photoelectric conversion elements arranged in the two-dimensional array,
outputs of the odd-numbered columns in the two-dimensional array and outputs of the even-numbered columns in the two-dimensional array are connected to two different row circuits, respectively, and the amplification factors of the two row circuits are different from each other.

13. The device according to claim 3, wherein a Bayer-pattern color filter array is operatively arranged such that color filters are assigned to the respective photoelectric conversion elements arranged in the two-dimensional array, the difference between output signals of two diagonally adjacent photoelectric conversion elements being corrected on the basis of a result of the comparison between detection signals generated from two diagonally adjacent photoelectric conversion elements to which the same-color filters are respectively assigned, the difference being caused by difference in pixel layout.

14. The device according to claim 3, wherein the device supports a driving mode for signal addition based on charge through the voltage conversion elements, and photoelectric conversion times of the photoelectric conversion elements, from which charge is simultaneously read out, are different from each other.

* * * * *